(12) United States Patent
Lee et al.

(10) Patent No.: US 8,906,584 B2
(45) Date of Patent: Dec. 9, 2014

(54) PHOTOMASK AND METHOD FOR FORMING PATTERN OF SEMICONDUCTOR DEVICE USING THE SAME

(71) Applicant: SK Hynix Inc., Icheon-si Gyeonggi-do (KR)

(72) Inventors: Byoung Hoon Lee, Seoul (KR); Chang Moon Lim, Seoul (KR); Myoung Soo Kim, Seongnam-si (KR); Jeong Su Park, Seoul (KR); Jun Taek Park, Seoul (KR); In Hwan Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 128 days.

(21) Appl. No.: 13/846,721

(22) Filed: Mar. 18, 2013

(65) Prior Publication Data
US 2014/0065524 A1    Mar. 6, 2014

(30) Foreign Application Priority Data

Aug. 31, 2012    (KR) ........................ 10-2012-0096293

(51) Int. Cl.
*G03F 1/38*    (2012.01)
*H01L 21/302*    (2006.01)
*H01L 21/027*    (2006.01)
*H01L 21/033*    (2006.01)

(52) U.S. Cl.
CPC ............. *G03F 1/38* (2013.01); *H01L 21/302* (2013.01); *H01L 21/0274* (2013.01); *H01L 21/033* (2013.01)
USPC .................................. 430/5; 430/22; 430/311

(58) Field of Classification Search
CPC ...... G03F 1/38; G03F 7/70633; H01L 21/302
USPC .................. 430/5, 22, 311, 313, 322, 394
See application file for complete search history.

(56) References Cited

U.S. PATENT DOCUMENTS 7,638,263 B2 *    12/2009    Sim ................................ 430/311

FOREIGN PATENT DOCUMENTS

| KR | 1020060018722 A | 3/2006 |
|---|---|---|
| KR | 100598988 B1 | 7/2006 |
| KR | 1020090044586 A | 5/2009 |
| KR | 1020100134417 A | 12/2010 |
| KR | 1020110047821 A | 5/2011 |
| KR | 1020110112727 A | 10/2011 |

* cited by examiner

*Primary Examiner* — Stephen Rosasco
(74) *Attorney, Agent, or Firm* — William Park & Associates Patent Ltd.

(57) ABSTRACT

A semiconductor device includes a cell mask pattern disposed in a cell region of a mask substrate and a vernier mask pattern disposed in a vernier region of the mask substrate. The vernier mask pattern includes a variable mask pattern portion to transfer a different shape of pattern depending on the magnitude of exposure energy.

20 Claims, 16 Drawing Sheets

PHOTOMASK AND METHOD FOR FORMING PATTERN OF SEMICONDUCTOR DEVICE USING THE SAME

CROSS-REFERENCES TO RELATED APPLICATIONS

The present application claims priority to Korean application number 10-2012-0096293, filed on Aug. 31, 2012, which is incorporated by reference in its entirety as set forth in full.

BACKGROUND

The present disclosure relates to a photomask for a semiconductor device and a method for forming a pattern of a semiconductor device using the same.

Due to the increase in degrees of integration for semiconductor devices, a pitch between patterns has continued to decrease. In order to form patterns having a smaller pitch, patterning techniques such as spacer patterning technology (hereafter, referred to as SPT), mesh-type SPT technology using two SPT processes, and extreme ultraviolet lithography technology have been proposed. However, since patterning techniques such as the SPT process and mesh-type SPT process include an increased number of process steps, device fabrication costs increase. Furthermore, since the mentioned patterning techniques require more complex processing, there are difficulties in applying the patterning technique for mass production. Although the extreme ultraviolet lithography technology has a relatively simple process, reliable equipment which may be applied for mass production has not been fully developed. Accordingly, there is still a demand for patterning-related technology which is capable of reliably implementing a small critical dimension (CD) that is more economical.

SUMMARY

In an embodiment, a photomask for a semiconductor device includes: a cell mask pattern disposed in a cell region of a mask substrate; and a vernier mask pattern disposed in a vernier region of the mask substrate. The vernier mask pattern includes a variable mask pattern portion to transfer a different pattern depending on the magnitude of exposure energy.

In another embodiment, there is provided a method of forming patterns of a semiconductor device. A substrate is prepared. A photomask including a cell mask pattern transferred to a cell region of the substrate and a vernier mask pattern transferred to a vernier region of the substrate is prepared, where the vernier mask pattern includes a variable mask pattern portion to transfer a different pattern depending on the magnitude of exposure energy. A first cell pattern layer and a first vernier pattern layer are formed over the substrate by applying an exposure and development process of the photomask using first exposure energy. The photomask is moved and disposed over the substrate such that the cell mask pattern is positioned between the first cell pattern layers in a state where the cell mask pattern does not overlap the first cell pattern layer. A second cell pattern layer and a second vernier pattern layer are formed over the substrate by applying an exposure and development process of the photomask using second exposure energy. The first exposure energy and the second exposure energy transfer different patterns of the variable mask pattern portion to the first vernier pattern layer and the second vernier pattern layer.

In another embodiment, there is provided a method of forming a pattern of a semiconductor device. A substrate having a pattern target layer is prepared. A first hard mask layer is formed over the pattern target layer. A photomask including a cell mask pattern and a vernier mask pattern is prepared, where the vernier mask pattern includes a variable mask pattern portion. A first cell photoresist pattern and a first vernier photoresist pattern are formed over the first hard mask layer by transferring a pattern of the photomask using first exposure energy. A first cell hard mask pattern layer and a first vernier hard mask pattern layer are formed over the pattern target layer by patterning the first hard mask layer using the first cell photoresist pattern and the first vernier photoresist pattern. A second hard mask layer is formed over the pattern target layer. The photomask is disposed over the second hard mask layer such that the cell mask pattern is positioned so as not to overlap the first cell hard mask pattern. A second cell photoresist pattern and a second vernier photoresist pattern are formed over the second hard mask layer by transferring the pattern of the photomask using second exposure energy. A second cell hard mask pattern layer and a second vernier hard mask pattern layer are formed over the pattern target layer by patterning the second hard mask layer using the second cell photoresist pattern and the second vernier photoresist pattern. The pattern target layer is patterned by using the first cell hard mask pattern layer, the first vernier hard mask pattern layer, the second cell hard mask pattern layer, and the second hard mask pattern layer. The first exposure energy and the second exposure energy transfer different patterns of the variable mask pattern portion to the first vernier photoresist pattern and the second vernier photoresist pattern.

BRIEF DESCRIPTION OF THE DRAWINGS

FIGS. 4A to 9A, FIGS. 4B to 9B, FIGS. 4C to 9C, and FIGS. 4D to 9D are diagrams illustrating the method for forming a pattern of a semiconductor device in accordance with an embodiment of the present disclosure.

DESCRIPTION OF SPECIFIC EMBODIMENTS

Figure 1:
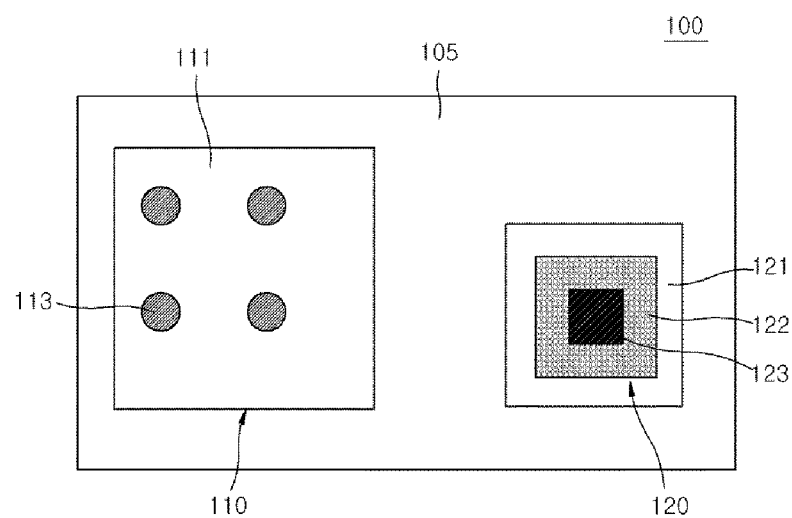
FIG. 1 is a diagram schematically illustrating a photomask for a semiconductor device in accordance with an embodiment of the present disclosure.

Hereinafter, various embodiments of the present disclosure will be described in detail with reference to the accompanying drawings. The drawings are not necessarily to scale and in some instances, proportions may have been exaggerated in order to clearly illustrate features of the embodiments. The descriptions of the drawings will be based on an observer's view point. In this specification, when one component is positioned on another component, this means that the one component may be positioned directly on another component or an additional element may be interposed therebetween. In the accompanying drawings, like reference numerals denote substantially the same components. Furthermore, it should be understood that a singular expression may include plural expressions as long as they are not clearly different from each other. Furthermore, it should be understood that terms such as 'include' and 'have' mean that a feature, a number, a step, an operation, a part, or a combination thereof exists, and do not exclude the existence or addition of one or more features, numbers, steps, operations, parts, or combinations thereof. Furthermore, when a method or fabrication method is performed, steps forming the method may occur in different sequences than designated in this specification, as long as specific sequence is not clearly described. That is, the respective steps may occur according to the designated sequence, occur at substantially the same time, or may occur according to the opposite sequence.

In this specification, a cell region of a mask substrate indicates a region where a pattern over the mask substrate corresponding to a pattern formed in a cell region of a semiconductor substrate exists, when the pattern of the mask substrate is transferred to the semiconductor substrate. Similarly, a vernier region of the mask substrate indicates a region where a pattern over the mask substrate corresponding to a pattern formed in a vernier region of the semiconductor substrate exists, when the pattern of the mask substrate is transferred to the semiconductor substrate. Vernier region of the semiconductor substrate may be area in the semiconductor substrate where vernier patterns for measuring overlay between at least two stacking layers are formed.

Referring to FIG. 1, the photomask 100 may include a cell mask pattern 110 and a vernier mask pattern 120 over a mask substrate 105. The mask substrate 105 may include a transparent substrate such as quartz, for example. For convenience of description, FIG. 1 illustrates a cell region of the mask substrate 105 where the cell mask pattern 110 exists and a vernier region of the mask substrate where the vernier mask pattern 120 exists. The vernier region may be an area such as a peripheral region, a cell region, or a scribe lane region of the mask substrate 105. It will be obvious to those skilled in the art that the present disclosure is not limited to the shape, size illustrated in FIG. 1.

The cell mask pattern 110 may include an opaque pattern portion 113. The opaque pattern portion 113 may include chrome, for example. As illustrated in FIG. 1, the opaque pattern portion 113 may include hole patterns arranged along a plurality of columns and rows. The cell mask pattern 110 may include a transparent pattern portion 111 corresponding to the part of the cell mask pattern 110 excluding the opaque pattern portion 113. For example, the transparent pattern portion 111 may correspond to a transparent material layer over the mask substrate 105 or an exposed surface of the mask substrate 105.

The vernier mask pattern 120 may include a transparent pattern portion 121, a variable mask pattern portion 122, and an opaque pattern portion 123. The transparent pattern portion 121 may correspond to a transparent material layer formed over the mask substrate 105 or an exposed surface of the mask substrate 105. The opaque pattern portion 123 may include chrome, for example.

The variable mask pattern portion 122 may determine whether or not to transfer a pattern depending on the magnitude of exposure energy. That is, whether for the variable mask pattern portion 122 to transfer a pattern may depend on light transmittance based on the exposure energy. For example, as the exposure energy increases, the light transmittance of the variable mask pattern portion may increase, and as the exposure energy decreases, the light transmittance of the variable mask pattern portion may decrease.

In an embodiment, when light having exposure energy less than or equal to a predetermined first critical value strikes, the transparent pattern portion 121 of the vernier mask pattern 120 may transmit the incident light, and the variable mask pattern portion 122 and the opaque pattern portion 123 may not transmit the incident light. Accordingly, when the exposure energy less than or equal to the first critical value is used to expose and develop a pattern of the vernier mask pattern 120, a pattern depending on the shapes of the variable mask pattern portion 122 and the opaque pattern portion 123 may be formed on the substrate.

On the other hand, when light having exposure energy greater than or equal to a predetermined second critical value strikes, the transparent pattern portion 121 and the variable mask pattern portion 122 of the vernier mask pattern 120 may transmit the incident light, and the opaque pattern portion 123 may not transmit the incident light. Accordingly, when the exposure energy greater than or equal to the second critical value is used to expose and develop the pattern of the vernier mask pattern 120, a pattern depending on the shape of the opaque pattern portion 123 may be formed on the substrate. The second critical value may be larger than the first critical value.

Since the cell mask pattern 110 does not include the variable mask pattern 122, patterns having substantially the same or similar shape may be formed on the substrate regardless of the magnitude of the exposure energy.

The variable mask pattern portion 122 may be disposed to be contacted with the opaque pattern portion 123. In an embodiment shown in FIG. 1, the variable mask pattern portion 122 may be disposed to surround the opaque pattern portion 123. However, the present disclosure is not limited thereto. In other embodiments, the variable mask pattern portion 122 may be disposed separately from the opaque pattern portion 123.

Figure 2A:
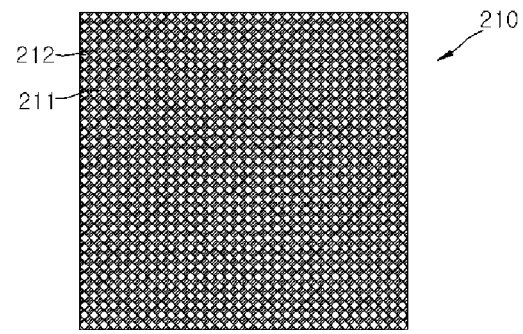
FIGS. 2A to 2C are plan views schematically illustrating a variable mask pattern portion of a vernier mask pattern in accordance with an embodiment of the present disclosure.
Figure 2B:
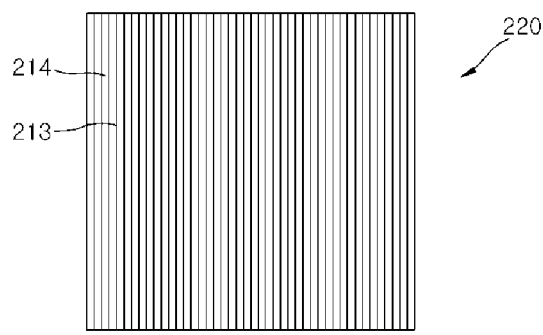
Figure 2C:
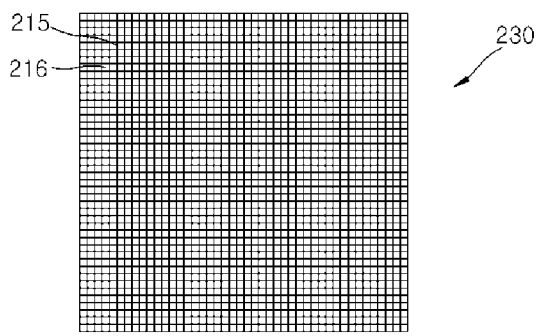

The variable mask pattern portions illustrated in FIGS. 2A to 2C may be fabricated to determine whether or not to transfer a pattern, depending on the magnitude of exposure energy. For example, the variable mask pattern portion may be fabricated in such a manner that light transmittance thereof varies depending on the magnitude of exposure energy.

Referring to FIGS. 2A to 2C, the variable mask patterns 210, 220, and 230 may include opaque mask pattern portions 211, 213, and 215 and transparent mask pattern portions 212, 214, and 216, respectively. The opaque mask pattern portions 211, 213, and 215 and the transparent mask pattern portions 212, 214, and 216, respectively, may be alternately arranged over the mask substrate. The opaque mask pattern portions 211, 213, and 215 and the transparent mask pattern portions 212, 214, and 216 may be regularly arranged to occupy substantially the same areas. The opaque mask pattern portions 211, 213, and 215 may include a metal such as chrome. Furthermore, each of the transparent mask pattern portions 212, 214, and 216 may correspond to a part of the transparent material layer or an exposed surface of the transparent mask substrate.

When first exposure energy less than or equal to the first critical value is incident on the variable mask pattern portion 210, 220, or 230, a pattern transferred to a lower photosensitive layer through the variable mask pattern portion 210, 220, or 230 may have substantially the same shape as the shape of a pattern transferred as if the entire part of the variable mask pattern portion 210, 220, or 230 was opaque, even with the transparent mask pattern portion 212, 214, or 216. The first critical value may be determined as a maximum value of exposure energy required for the pattern transferred through the variable mask pattern portion 210, 220, or 230 to have the above-described shape. On the other hand, when second exposure energy greater than or equal to the second critical value is incident on the variable mask pattern portion 210, 220, or 230, a pattern transferred to the lower photosensitive layer through the variable mask pattern portion 210, 220, or 230 may have substantially the same shape as the shape of a pattern transferred as if the entire part of the variable mask pattern portion 210, 220, or 230 was transparent, even with the opaque mask pattern portion 211, 213, or 215. The second critical value may be determined as a minimum value of exposure energy required for the pattern transferred through the variable mask pattern portion 210, 220, or 230 to have the above-described shape. The light transmission characteristic of the above-described variable mask pattern portions 210, 220, and 230 may result from interference by the opaque mask pattern portions 211, 213, and 215 based on the exposure energy.

Furthermore, for exposure energy existing between the first and second critical values, the variable mask pattern portions 210, 220, and 230 may not sufficiently block or transmit incident light. Therefore, the exposure energy between the first and second critical values may not be applied during exposure.

As illustrated in FIG. 2A, the opaque mask pattern portion 211 may include dot patterns, and the transparent mask pattern portion 212 may include space patterns between the respective dot patterns. Hereafter, the respective patterns are referred to as dot and space patterns. The dot patterns may have a diamond shape, for example. However, the dot patterns are not limited thereto, but may have a circular shape, an elliptical shape, or a polygonal shape such as a triangle, rectangle, or pentagon. Two or more of the shapes may be combined and applied.

Referring to FIG. 2B, the opaque mask pattern portion 213 may include line patterns, and the transparent mask pattern portion 214 may include space patterns between the respective line patterns. Hereafter, the respective patterns are referred to as line and space patterns. Referring to FIG. 2C, different line patterns may be implemented to intersect each other in different directions, and space patterns may be implemented at the respective intersections between the light patterns.

Although, it is not shown in the drawing, in some embodiments, the variable mask pattern portion 122 of vernier mask pattern 120 may not include opaque mask pattern portions and transparent mask pattern portions. Instead, the variable mask pattern portion 122 may include material having variable light transmittance according to energy of incident light. In an embodiment, the material for applying to the variable mask pattern portion 122 may be selected that the material is opaque when exposure energy of incident light is less than or equal to the first critical value, and is transparent when exposure energy is greater than or eqal to the second critical value. For example, the material may include MoSiN. Composition or thickness of the material may be controlled for determining the first and second critical value.

Figure 3:
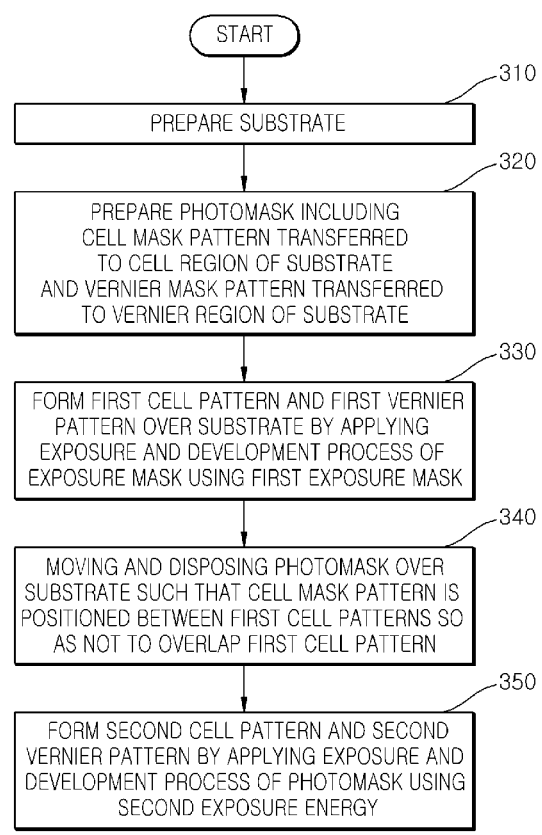
FIG. 3 is a flowchart showing a method for forming a pattern of a semiconductor device in accordance with an embodiment of the present disclosure.

Referring to FIG. 3, at step 310, a substrate may be prepared. The substrate may include a pattern target layer for forming a pattern. The substrate may also include a semiconductor substrate for fabricating a device.

At step 320, a photomask including a cell mask pattern to be transferred to a cell region of the substrate and a vernier mask pattern to be transferred to a vernier region of the substrate may be prepared. The vernier mask pattern may include a variable mask pattern portion to determine whether or not to transfer a pattern, depending on the magnitude of exposure energy. Whether or not a pattern is to be transferred through the variable mask pattern portion may depend on light transmittance of the variable mask pattern portion based on the exposure energy. As the exposure energy increases, the light transmittance of the variable mask pattern portion may increase, and as the exposure energy decreases, the light transmittance of the variable mask pattern portion may decrease. For example, the photomask may include the photomask 100 illustrated in FIG. 1, and the variable mask pattern portion may include the variable mask pattern portions 210, 220, and 230 illustrated in FIGS. 2A, 2B, and 2C.

At step 330, an exposure and development process of the photomask using first exposure energy may be applied to form a first cell pattern and a first vernier pattern on the substrate. In accordance with an embodiment of the present disclosure, the first cell pattern and the first vernier pattern may be formed as follow. First, a target material layer and a photoresist layer may be successively formed over the substrate, and the exposure and development process using the first exposure energy may be applied to form a photoresist pattern layer. Then, as the photoresist pattern layer is used to pattern the target material layer, the first cell pattern and the first vernier pattern may be formed on the substrate. The first cell pattern may correspond to the cell mask pattern of the photomask, and the first vernier pattern may correspond to the vernier mask pattern of the photomask.

At step 340, the photomask may be moved over the substrate such that the cell mask patterns are positioned between the first cell patterns in a state in which the cell mask patterns do not overlap the first cell pattern. That is, the photomask may be disposed over the substrate having the first cell pattern and the first vernier pattern formed thereon such that the first cell pattern over the substrate and the cell mask pattern over the photomask do not overlap each other. Furthermore, the photomask may be disposed over the substrate such that the cell mask patterns are positioned between the cell patterns.

At step 350, an exposure and development process of the photomask using second exposure energy may be applied to form a second cell pattern and a second vernier pattern over the substrate. In accordance with an embodiment of the present disclosure, the second cell pattern and the second vernier pattern may be formed over the substrate as follows. First, a target material layer and a photoresist layer may be successively formed over the substrate having the first cell pattern and the first vernier pattern formed thereon, and the exposure and development process using the second exposure energy may be applied to form a photoresist pattern layer. Then, as the photoresist pattern layer is used to pattern the target material layer, the second cell pattern and the second vernier pattern may be formed over the substrate. The second cell pattern may correspond to the cell mask pattern of the photomask, and the second vernier pattern may correspond to the vernier mask pattern of the photomask.

During the above-described process, the first exposure energy and the second exposure energy may transfer the pattern of the variable mask pattern portion as the first and second vernier patterns. Accordingly, the first and second vernier patterns may have different shapes. For example, any one of the first and second vernier patterns may be formed inside the other pattern.

As described with reference to FIGS. 1, 2A, 2B, and 2C, the first and second cell patterns transferred from the cell mask pattern of the photomask may be formed separately from each other in a state where the first and second cell patterns do not overlap each other. The first cell pattern and the second cell pattern may have substantially the same shape. The first and second cell patterns may include hole patterns arranged along a plurality of columns and rows, for example.

When the pattern formation method using the photomask having the above-described variable mask pattern portion is used, it is possible to easily measure overlay between upper and lower patterns while a plurality of patterning processes using a single mask are performed. That is, a pattern of a single mask may be used to form the first cell pattern and the first vernier pattern as a lower layer. Furthermore, the pattern of the single mask may be used to form the second cell pattern and the second vernier pattern as an upper layer. The lower or upper layer may include a hard mask pattern layer or photoresist pattern layer. In accordance with an embodiment of the present disclosure, the first and second vernier patterns may have different shapes depending on whether or not a pattern is to be transferred by the variable mask pattern portion. As the first and second vernier patterns have different shapes, it becomes relatively easy to measure a pitch between the first and second vernier patterns. Therefore, it is possible to easily measure the overlay between the first and second cell patterns.

FIGS. 4A to 9A are plan views illustrating a method for forming a cell pattern over a substrate, and FIGS. 4C to 9C are cross-sectional views taken along lines A-A' of FIGS. 4A to 9A. FIGS. 4B to 9B are plan views schematically illustrating a method for forming a vernier pattern over the substrate, and FIGS. 4D to 9D are cross-sectional views taken along lines B-B' of FIGS. 4B to 9B.

Referring to FIGS. 4A, 4B, 4C, and 4D, a pattern target layer 420, a first hard mask layer 430, and a first photoresist layer (not illustrated) may be sequentially formed over the substrate 410. The pattern target layer 420 may indicate a material layer in which a pattern is to be finally implemented, and may include oxide, silicon, or metal, for example. The first hard mask layer 430 may include oxide, nitride, or oxynitride. The first hard mask layer 430 may be formed by a chemical vapor deposition (CVD) method, a physical vapor deposition (PVD) method, or a coating method which are well-known to those skilled in the art. The first photoresist layer may be formed of a photosensitive material having a negative tone.

When the above-described photomask 100 described with reference to FIGS. 1, 2A, 2B, and 2C, is prepared, the first photoresist layer may be exposed and developed at the first exposure energy so as to form a first photoresist pattern layer. The first photoresist pattern layer may include a first cell photoresist pattern 445 transferred from the cell mask pattern 110 of the photomask 100 in the cell region of the substrate 410 and a first vernier photoresist pattern 447 transferred from the vernier mask pattern 120 of the photomask 100 in the vernier region of the substrate 410.

In an embodiment of the present disclosure, the first exposure energy may be less than or equal to the above-described first critical value, and may transfer the vernier mask pattern 120 to the first photoresist layer in the same shape as the shape of a pattern transferred as if the entire part of the variable mask pattern 210, 220, or 230 was opaque.

Figure 4A:
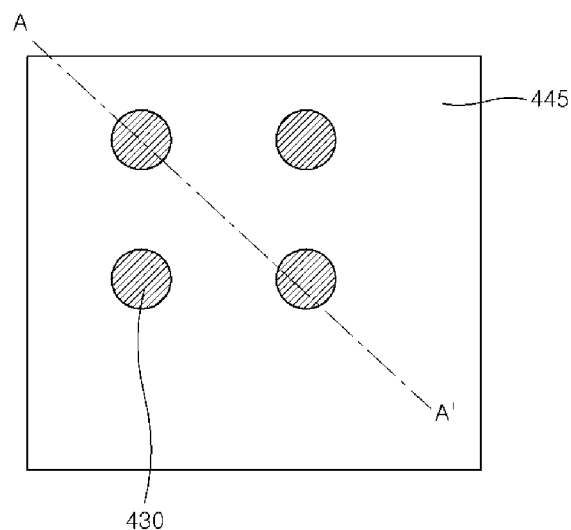
Figure 4B:
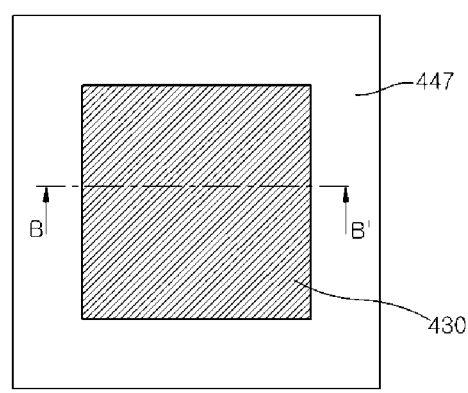
Figure 4C:
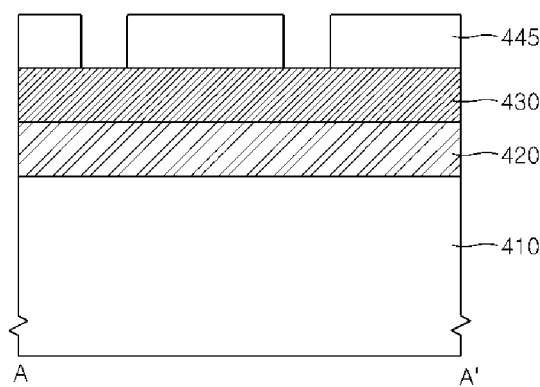

Referring to FIGS. 4A and 4C, the above-described first exposure energy may be used to form the first cell photoresist pattern 445 over the first hard mask layer 430 in the cell region of the substrate 410. Furthermore, referring to FIGS. 4B and 4D, the first exposure energy may be used to form the first vernier photoresist pattern 447 over the first hard mask layer 430 in the vernier area of the substrate 410. The first cell photoresist pattern 445 may include hole patterns arranged along a plurality of columns and rows, and the first vernier photoresist pattern 447 may include contact patterns having a predetermined width.

Referring to FIGS. 5A, 5B, 5C, and 5D, the first cell photoresist pattern 445 and the first vernier photoresist pattern 447 may be used as an etch mask to pattern the first hard mask layer 430. The patterning process may be performed by a dry etching or wet etching process, for example. Accordingly, a first cell hard mask pattern layer 435 may be formed over the pattern target layer 420 in the cell region of the substrate 410, and a first vernier hard mask pattern layer 437 may be formed over the pattern target layer 420 in the vernier region of the substrate 410. The first cell hard mask pattern layer 435 may include hole patterns arranged along a plurality of columns and rows, and the first vernier hard mask pattern layer 437 may include contact patterns having a predetermined width.

Referring to FIGS. 6A, 6B, 6C, and 6D, a second hard mask layer 450 may be formed over the substrate 410 having the first cell hard mask pattern layer 435 and the first vernier hard mask pattern layer 437 formed thereon. The second hard mask layer 450 may be formed of a material having an etching selectivity with respect to the material of the first cell hard mask pattern layer 435 and the first vernier hard mask pattern layer 437. For example, when the first cell hard mask pattern layer 435 and the first vernier hard mask pattern layer 437 include oxide, the second hard mask layer 450 may include nitride. As another example, when the first cell hard mask layer 435 and the first vernier hard mask pattern layer 437 include nitride, the second hard mask layer 450 may include oxide. The second hard mask layer 450 may be formed by the CVD method, the PVD method, or the coating method, for example.

Referring to FIGS. 7A, 7B, 7C, and 7D, a second photoresist layer (not illustrated) may be formed over the second hard mask layer 450. The second photoresist layer may be formed of a photosensitive material having a negative tone. Then, the photomask 100 may be disposed over the second photoresist layer such that the cell mask pattern 110 does not overlap the first cell hard mask pattern 435 disposed thereunder. When the cell mask pattern 110 does not overlap the first cell hard mask pattern 435, it may mean that a pattern formed when supposing that the first cell hard mask pattern 435 is projected into the second photoresist layer in a vertical direction (that is, a direction perpendicular to the first and second directions) does not overlap a pattern formed when the cell mask pattern 110 is transferred to the second photoresist layer. Furthermore, the photomask 100 may be disposed over the second photoresist layer such that the cell mask patterns 110 are regularly positioned between the first cell hard mask pattern layer 435.

The second exposure energy may be used to expose and develop the second photoresist layer, thereby forming a second photoresist pattern layer. The second photoresist pattern layer may include a second cell photoresist pattern 465 transferred from the cell mask pattern 110 of the photomask 100 in the cell region of the substrate 410 and a second vernier photoresist pattern 467 transferred from the vernier mask pattern 120 of the photomask 100 in the vernier area of the substrate 410.

The second exposure energy is greater than or equal to the above-described second critical value, and may indicate energy which is capable of transferring the vernier mask pattern 120 to the second photoresist layer in the same shape as if the shape of a pattern transferred when the entire part of the variable mask pattern portion 210, 220, or 230 is transparent.

Figure 7A:
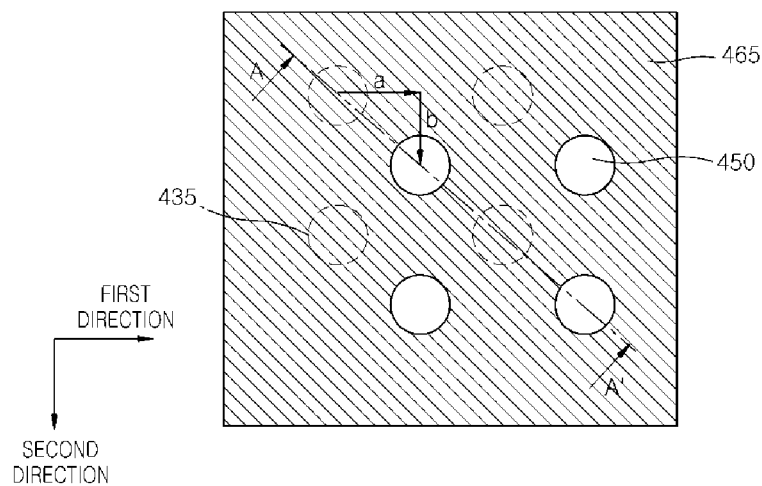
Figure 7B:
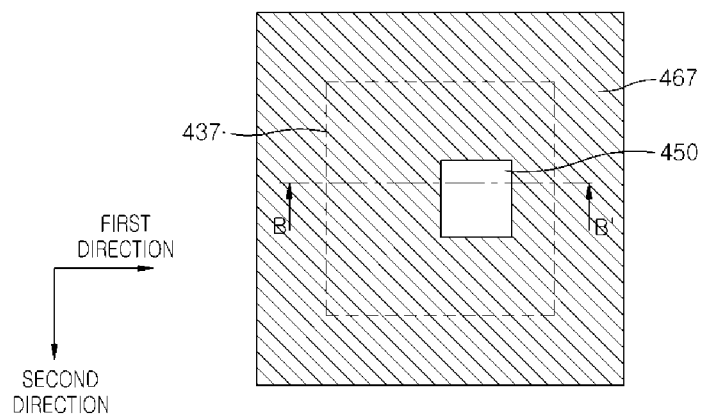
Figure 7C:
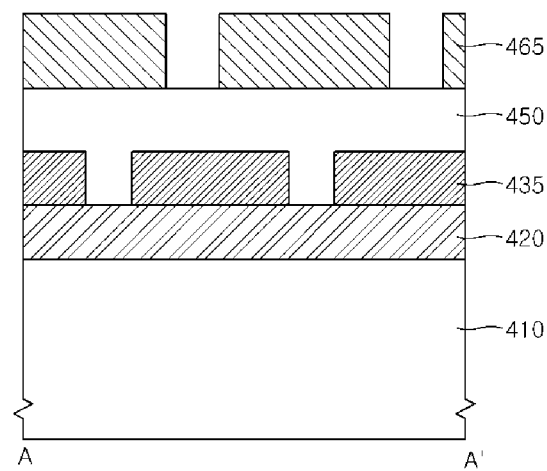

Referring to FIGS. 7A and 7C, the above-described second exposure energy may be used to form the second cell photoresist pattern 465 over the second hard mask layer 450 in the cell region of the substrate 410. Furthermore, referring to FIGS. 7B and 7D, the second exposure energy may be used to form the second vernier photoresist pattern 467 over the second hard mask layer 450 in the vernier region of the substrate 410. The second cell photoresist pattern 465 may include hole patterns arranged along a plurality of columns and rows, and the second vernier photoresist patterns 467 may include contact patterns having a predetermined width.

Figure 4D:
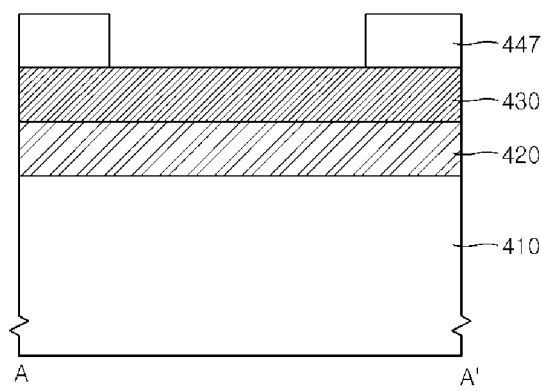
Figure 5A:
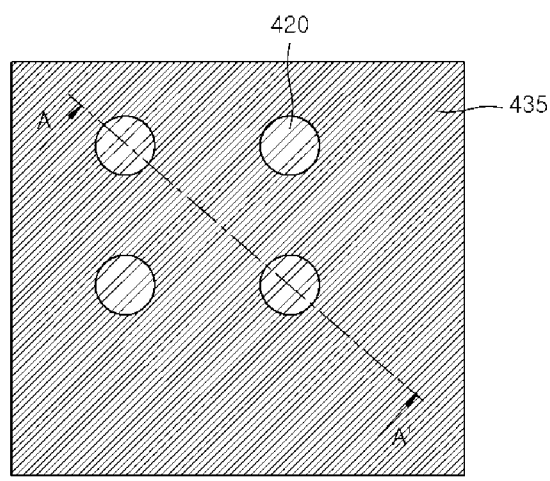
Figure 5B:
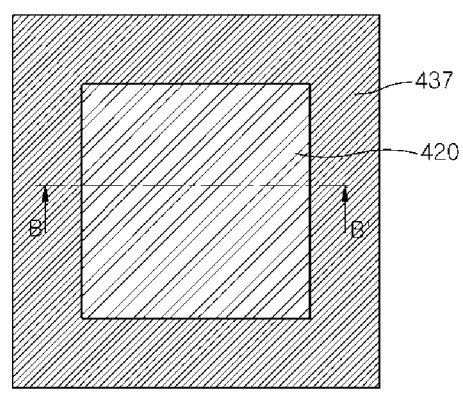
Figure 5C:
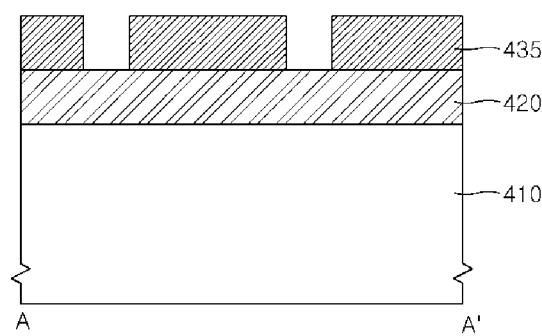
Figure 5D:
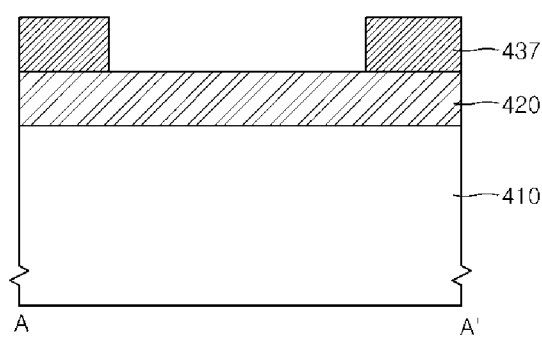
Figure 6A:
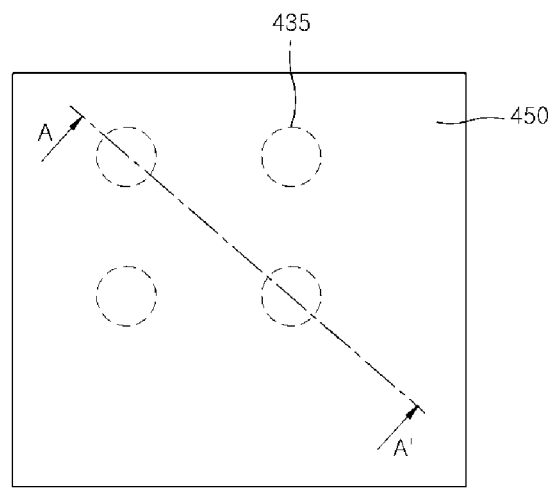
Figure 6B:
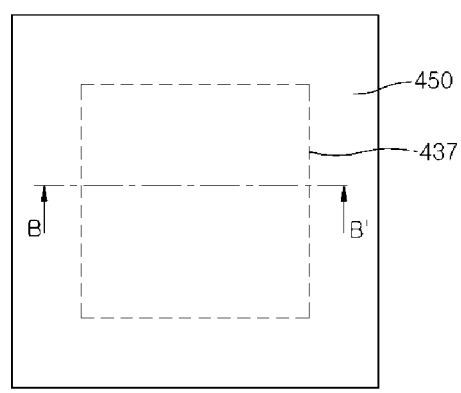
Figure 6C:
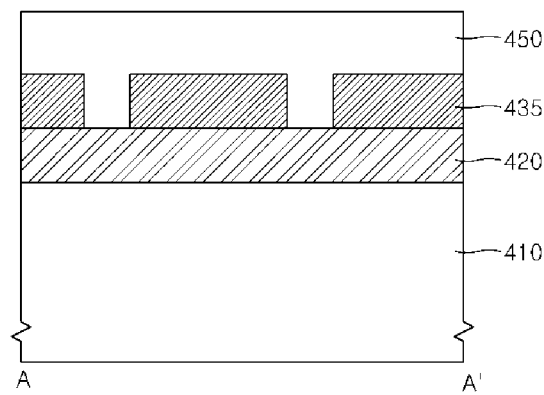
Figure 6D:
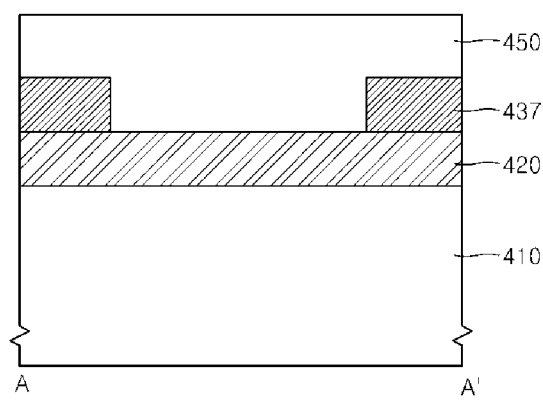
Figure 7D:
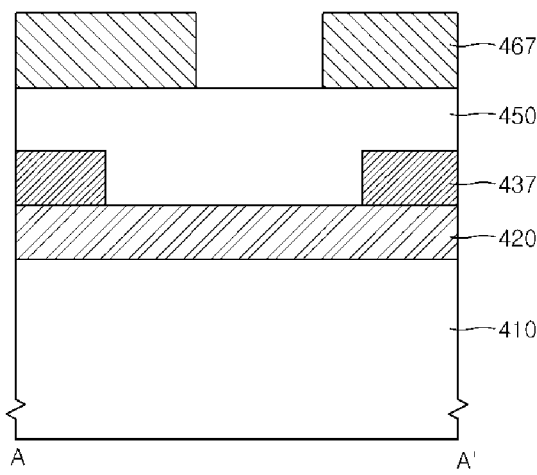

In A second exposure energy different from the first exposure energy may be used to expose and develop the second photoresist layer, thereby forming the second photoresist pattern layer. As illustrated in FIGS. 7B and 7D, the second vernier photoresist pattern 467 formed in the vernier area of the substrate 410 may have a different shape from the first vernier photoresist pattern 447 formed in the vernier region of the substrate 410 by the first exposure energy as illustrated in FIGS. 4B and 4D. Such a difference may occur depending on whether or not the pattern of the variable mask pattern portion is to be transferred according to the exposure energy difference.

Referring to FIG. 7A, the second cell photoresist pattern 465 of the substrate 410 may be moved at predetermined pitches in the first and second directions of the substrate 410, respectively, compared to the first cell photoresist pattern 445 of FIG. 4A. For example, the second cell photoresist pattern 465 may be moved at pitches 'a' and 'b' in the first and second directions, respectively, compared to the first cell hard mask pattern layer 435. Referring to FIGS. 7B and 7D, the second vernier photoresist pattern 467 of the substrate 410 may be moved at predetermined pitches in the first and second directions of the substrate 410, respectively, compared to the first vernier photoresist pattern 447 of FIG. 4B or the first vernier hard mask pattern layer 437 of FIG. 7B. Simultaneously, the second vernier photoresist pattern 467 may be positioned inside the boundary of the first vernier photoresist pattern 447 or the first vernier hard mask pattern layer 437.

Since the vernier mask pattern of the photomask may be transferred in different shapes due to the exposure energy difference, the interlayer overlay may be easily measured. In this embodiment, when the single photomask is used to perform a plurality of patterning processes, the first vernier hard mask pattern 437 may be formed through the first exposure process using the first exposure energy. Then, the second vernier photoresist pattern 467 may be formed through the second exposure process using the second exposure energy. Furthermore, as a pitch between the first vernier hard mask pattern 437 and the second vernier hard mask pattern 467 may be measured through an optical device, the overlay between the patterns may be calculated. When the calculated overlay is within manufacturing limits, subsequent processes may be performed to form a second cell hard mask pattern layer 455 between the first cell hard mask pattern layers 435.

Figure 8A:
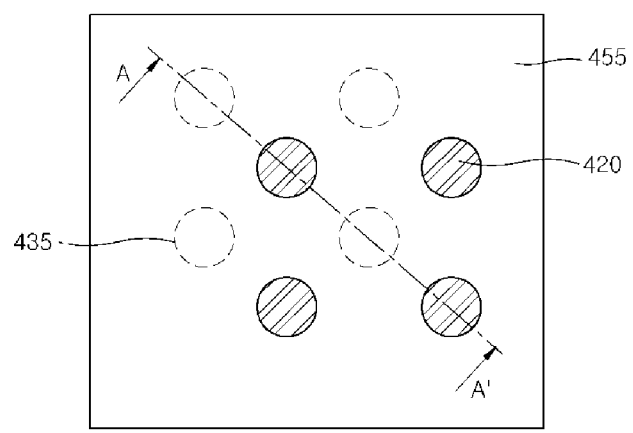
Figure 8B:
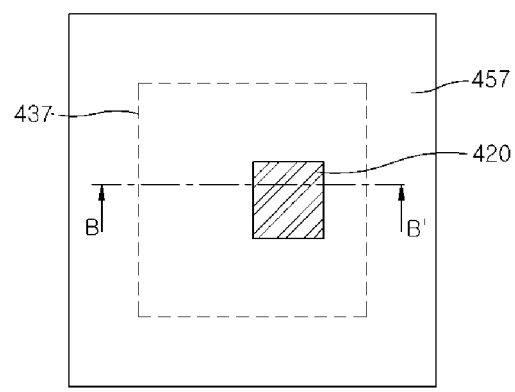
Figure 8C:
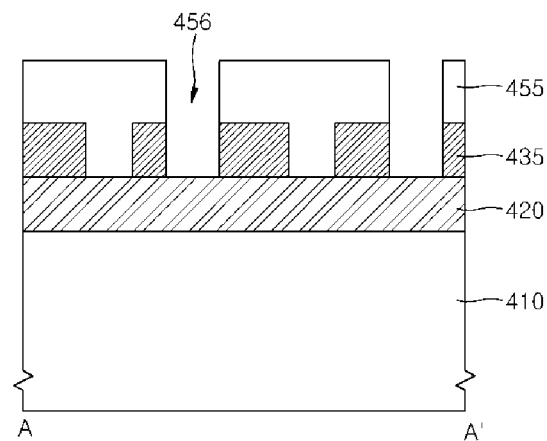

Referring to FIGS. 8A, 8B, 8C, and 8D, the second photoresist pattern may be used to pattern the second hard mask layer 450, thereby forming the second cell hard mask pattern layer 455 and the second vernier hard mask pattern layer 457 over the pattern target layer 420. Referring to FIGS. 8A and 8C, the forming of the second cell hard mask pattern layer 455 over the pattern target layer 420 may be performed as follows. First, the second cell photoresist pattern 465 may be used to etch the second hard mask layer 450. Then, the first cell hard mask pattern layer 435 positioned under the second cell photoresist pattern 465 may be additionally etched. Accordingly, referring to FIGS. 8A and 8C, hole patterns 456 may be formed to selectively expose the pattern target layer 420 in the cell region of the substrate 410.

Figure 8D:
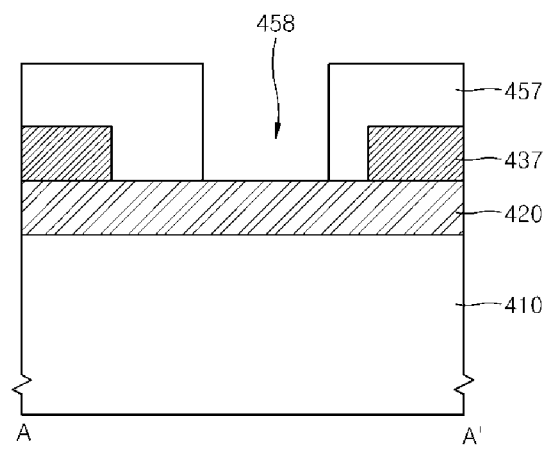
Figure 9A:
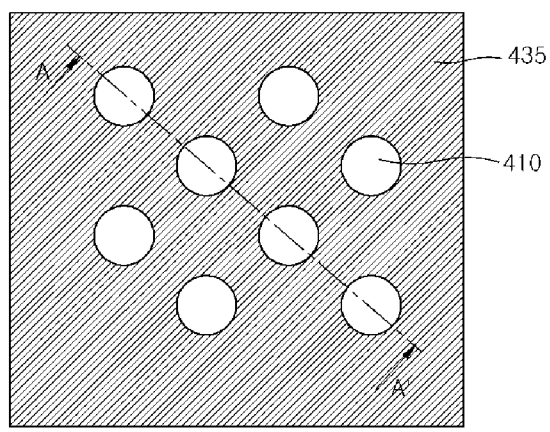
Figure 9B:
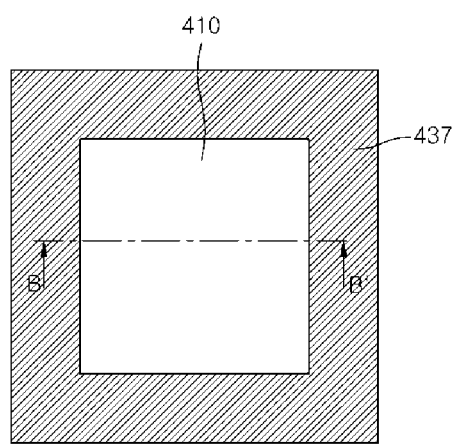
Figure 9C:
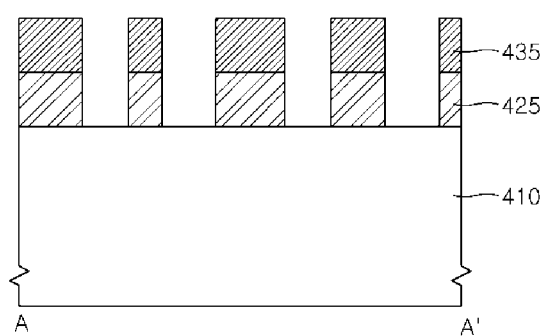
Figure 9D:
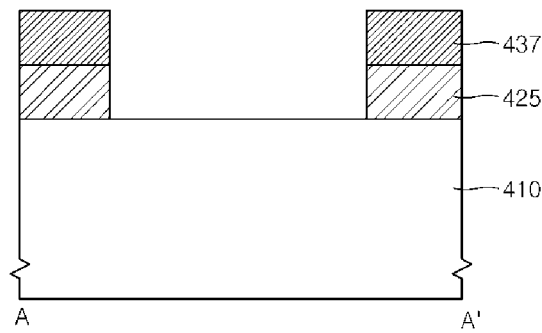

Similarly, referring to FIGS. 8B and 8D, the second vernier photoresist pattern 467 may be used to etch the second hard mask layer 450, thereby forming a contact pattern 458 to selectively expose the pattern target layer 420 in the vernier region of the substrate 410. As illustrated in FIGS. 8B and 8D, the contact pattern 458 may be formed in a contact pattern defined by the first vernier hard mask pattern layer 437.

Accordingly, the second cell hard mask pattern layer 455 and the second vernier hard mask pattern layer 457 may be removed. As described above, the second cell hard mask pattern layer 455 and the second vernier hard mask pattern layer 457 may be formed of a material having an etching selectivity with respect to the first cell hard mask pattern layer 435 and the first vernier hard mask pattern layer 437. Therefore, a well-known dry etching or wet etching process may be performed to remove the second cell hard mask pattern layer 455 and the second vernier hard mask pattern layer 457 from the substrate 410. Although the second cell hard mask pattern layer 455 may be removed, the pattern of the second cell hard mask pattern layer 455 may be transferred to the first cell hard mask pattern layer 435 by the patterning process performed as illustrated in FIGS. 8A, 8B, 8C, and 8D.

On the other hand, the second vernier photoresist pattern 467 has already performed the overlay measurement function with respect to the first vernier hard mask pattern layer 437. Therefore, the second vernier hard mask pattern layer 457 may be removed from the substrate 410 without additionally transferring a pattern to the first vernier hard mask pattern layer 437.

Referring to FIGS. 9A, 9B, 9C, and 9D, the first cell hard mask pattern layer 435 to which the pattern of the second cell hard mask pattern layer 455 was additionally transferred may be used as an etch mask to etch the pattern target layer 425. Accordingly, referring to FIGS. 9A and 9C, a predetermined pattern layer may be formed in the cell region of the substrate. The pattern layer may include hole patterns arranged along a plurality of columns and rows, for example. The first vernier hard mask pattern layer 437 may be used as an etch mask to etch the pattern target layer 425, thereby forming a predetermined pattern layer in the vernier region of the substrate 410. The pattern layer may include a contact pattern having a predetermined width, for example.

Figure 10:
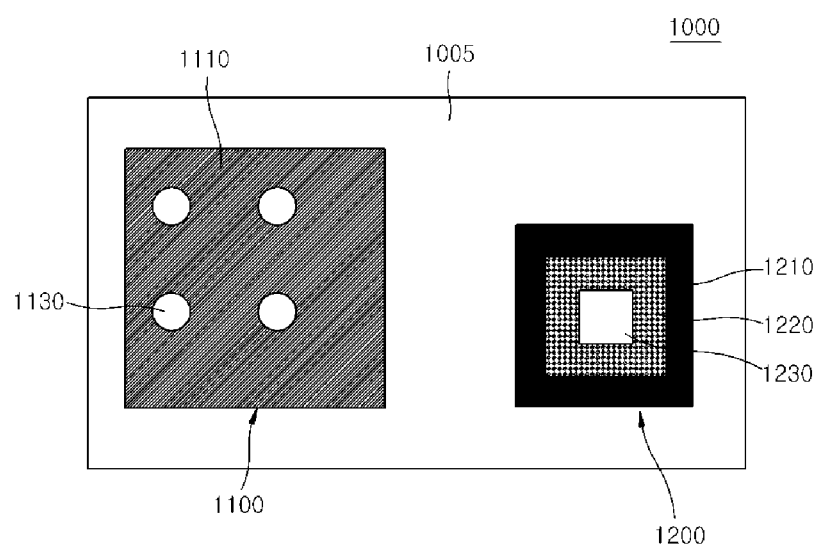
FIG. 10 is a diagram schematically illustrating a photomask for a semiconductor device in accordance with another embodiment of the present disclosure.

In an embodiment described with reference to FIGS. 4A to 9A, FIGS. 4B to 9B, FIGS. 4C to 9C, and FIGS. 4D to 9D, the photoresist layer having a negative tone may be used, and the photomask 100 corresponding to the photoresist layer may be applied. However, the present disclosure is not limited thereto. In other embodiments, a photoresist layer having a positive tone may be applied, and a photomask corresponding to the photoresist layer having a positive tone may be used. The vernier mask pattern may include a variable mask pattern to determine whether or not to transfer a pattern, depending on the magnitude of incident exposure energy. FIG. 10 illustrates a photomask when a photoresist layer having a positive tone is used, in accordance with another embodiment of the present disclosure. Referring to FIG. 10, the photomask 1000 may include a cell mask pattern 1100 and a vernier mask pattern 1200 over a mask substrate 1005. The photomask 1000 may have substantially the same or similar structure as the photomask 100 of FIG. 1, except that an opaque pattern region and a transparent pattern region are swapped with each other. The cell mask pattern 1100 may include an opaque pattern portion 1110, and the opaque pattern portion 1110 may include chrome, for example. Furthermore, the cell mask pattern 1100 may include a transparent pattern portion 1130 corresponding to the part of the cell mask pattern 1100 excluding the opaque pattern portion 1110. The vernier mask pattern 1200 may include an opaque pattern portion 1210, a variable mask pattern portion 1220, and a transparent pattern portion 1230. The variable mask pattern portion 1220 may determine whether or not to transfer a pattern, depending on the magnitude of exposure energy.

In accordance with the embodiment of the present disclosure, the variable mask pattern portion may be disposed adjacent to the transparent pattern portion or the opaque pattern portion, and may have a similar shape to the transparent pattern portion or opaque pattern portion. However, the present disclosure is not limited thereto. As long as the pattern transfer of the variable mask pattern portion occurs differently depending on exposure energies, the variable mask pattern portion may have a different shape from the transparent pattern portion or opaque pattern portion. The cell mask pattern may further include hole patterns. However, the present disclosure is not limited thereto, and may be applied to various shapes of patterns requiring a small pitch.

In accordance with various embodiments of the present disclosure, the single photomask has been described to perform a plurality of patterning processes. That is, it is possible to easily measure overlay between the pattern layers formed when the single photomask is used to perform a plurality of patterning processes. The plurality of patterning processes may be applied to a process of forming a storage node contact hole of DRAM. However, the present disclosure is not limited thereto, and may be applied to another process of DRAM. Furthermore, the plurality of patterning processes may be applied to a process for another semiconductor device such as a flash memory or resistive semiconductor device.

As the single photomask is used to perform a plurality of patterning processes, a minute cell pattern may be formed on the substrate. Since the vernier mask pattern of the photomask may include the variable mask pattern portion, different shapes of vernier patterns may be formed on the substrate depending on the magnitude of exposure energy.

The embodiments of the present disclosure have been disclosed above for illustrative purposes. Those skilled in the art will appreciate that various modifications, additions and substitutions are possible, without departing from the scope and spirit of the disclosure as disclosed in the accompanying claims.

What is claimed is:

1. A photomask for a semiconductor device, comprising:
   a cell mask pattern disposed in a cell region of a mask substrate; and
   a vernier mask pattern disposed in a vernier region of the mask substrate,
   wherein the vernier mask pattern comprises a variable mask pattern portion to transfer a different shape of cell pattern depending on the magnitude of exposure energy.

2. The photomask of claim 1, wherein the variable mask pattern portion has a light transmittance which varies depending on the exposure energy.

3. The photomask of claim 1, wherein the variable mask pattern portion comprises an opaque mask pattern portion and a transparent mask pattern portion.

4. The photomask of claim 1, wherein the variable mask pattern portion comprises line and space patterns or dot and space patterns.

5. The photomask of claim 1, wherein the cell mask pattern comprises hole patterns arranged along a plurality of columns and rows.

6. A method of forming a pattern of a semiconductor device, comprising:
   preparing a substrate;
   preparing a photomask including a cell mask pattern transferred to a cell region of the substrate and a vernier mask pattern transferred to a vernier region of the substrate, the vernier mask pattern including a variable mask pattern portion to transfer a different pattern depending on the magnitude of exposure energy;
   forming a first cell pattern layer and a first vernier pattern layer over the substrate by applying an exposure and development process of the photomask using a first exposure energy;
   moving and disposing the photomask over the substrate such that the cell mask pattern is positioned between the first cell pattern layers in a state where the cell mask pattern does not overlap the first cell pattern layer; and
   forming a second cell pattern layer and a second vernier pattern layer over the substrate by applying an exposure and development process of the photomask using a second exposure energy,
   wherein the first exposure energy and the second exposure energy transfer different patterns of the variable mask pattern portion to the first vernier pattern layer and the second vernier pattern layer.

7. The method of claim 6, wherein the pattern transfer of the variable mask pattern portion is determined by light transmittance through the variable mask pattern portion depending on the exposure energy.

8. The method of claim 7, wherein as the exposure energy increases, the light transmittance of the variable mask pattern portion increases, and as the exposure energy decreases, the light transmittance of the variable mask pattern portion decreases.

9. The method of claim 6, wherein the variable mask pattern portion comprises line and space patterns or dot and space patterns.

10. The method of claim 6, wherein the second cell pattern layer and the first cell pattern layer do not overlap each other, and
    the first vernier layer pattern layer and the second vernier pattern layer are formed differently, depending on whether or not a pattern is to be transferred through the variable mask pattern portion.

11. The method of claim 6, wherein the second cell pattern layer is disposed to be spaced from the first cell pattern layer, and
    the pattern of any one of the first or second vernier pattern layers is formed inside any one of the second or first vernier pattern layers, respectively.

12. The method of claim 6, wherein the first and second cell pattern layers comprise hole patterns arranged along a plurality of columns and rows.

13. The method of claim 6, wherein the first and second cell pattern layers are formed to have the same shape.

14. A method of forming a pattern of a semiconductor device, comprising:
    preparing a substrate having a pattern target layer;
    forming a first hard mask layer over the pattern target layer;
    preparing a photomask including a cell mask pattern and a vernier mask pattern, the vernier mask pattern including a variable mask pattern portion;
    forming a first cell photoresist pattern and a first vernier photoresist pattern over the first hard mask layer by transferring a pattern of the photomask using first exposure energy;
    forming a first cell hard mask pattern layer and a first vernier hard mask pattern layer over the pattern target layer by patterning the first hard mask layer using the first cell photoresist pattern and the first vernier photoresist pattern;
    forming a second hard mask layer over the pattern target layer;
    disposing the photomask over the second hard mask layer such that the cell mask pattern is positioned so as not to overlap the first cell hard mask pattern;

forming a second cell photoresist pattern and a second vernier photoresist pattern over the second hard mask layer by transferring the pattern of the photomask using second exposure energy;

forming a second cell hard mask pattern layer and a second vernier hard mask pattern layer over the pattern target layer by patterning the second hard mask layer using the second cell photoresist pattern and the second vernier photoresist pattern; and patterning the pattern target layer using the first cell hard mask pattern layer, the first vernier hard mask pattern layer, the second cell hard mask pattern layer, and the second hard mask pattern layer, wherein the first exposure energy and the second exposure energy transfer different patterns of the variable mask pattern portion to the first vernier photoresist pattern and the second vernier photoresist pattern.

15. The method of claim 14, wherein the pattern transfer of the variable mask pattern portion is determined by light transmittance through the variable mask pattern portion depending on the exposure energy.

16. The method of claim 14, wherein as the exposure energy increases, the light transmittance of the variable mask pattern portion increases, and as the exposure energy decreases, the light transmittance of the variable mask pattern portion decreases.

17. The method of claim 14, wherein the variable mask pattern portion comprises line and space patterns or dot and space patterns.

18. The method of claim 14, wherein the forming of the second cell hard mask pattern layer over the pattern target layer comprises:

etching the second hard mask layer using the second cell photomask pattern; and additionally etching the first cell hard mask pattern layer positioned under the second cell photomask pattern.

19. The method of claim 18, wherein the patterning of the pattern target layer comprises etching the pattern target layer using the etched first cell hard mask pattern layer as an etch mask.

20. The method of claim 18, wherein the patterning of the pattern target layer comprises forming hole patterns to be arranged along a plurality of columns and rows in the cell region of the substrate.

* * * * *